(12) United States Patent
Guinea et al.

(10) Patent No.: US 6,990,122 B2
(45) Date of Patent: Jan. 24, 2006

(54) SYNCHRONISM PHASE-SWITCHING CIRCUIT FOR THE RECOVERY OF RECEIVED DATA

(75) Inventors: Jesus Guinea, Bergamo (IT); Massimiliano Rutar, Milan (IT); Luciano Tomasini, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 800 days.

(21) Appl. No.: 09/784,549

(22) Filed: Feb. 15, 2001

(65) Prior Publication Data

US 2001/0040888 A1 Nov. 15, 2001

(30) Foreign Application Priority Data

Feb. 24, 2000 (EP) .................................. 00830131

(51) Int. Cl.
*H04J 3/06* (2006.01)
(52) U.S. Cl. ........................ 370/518; 375/293; 375/354
(58) Field of Classification Search ................ 370/516, 370/517, 518, 519; 375/354, 371, 373, 376, 375/293, 294, 327, 328
See application file for complete search history.

(56) References Cited

U.S. PATENT DOCUMENTS

| | | | | |
|---|---|---|---|---|
| 4,229,699 A | * | 10/1980 | Frissell | 327/114 |
| 4,419,629 A | * | 12/1983 | O'Brien | 327/99 |
| 4,805,195 A | * | 2/1989 | Keegan | 375/354 |
| 4,819,251 A | | 4/1989 | Nelson | 375/119 |
| 4,853,653 A | * | 8/1989 | Maher | 331/49 |
| 4,888,729 A | | 12/1989 | Nelson | 364/900 |
| 5,022,056 A | * | 6/1991 | Henderson et al. | 375/373 |
| 5,844,908 A | * | 12/1998 | McCallan | 370/518 |
| 5,903,616 A | | 5/1999 | Rangan et al. | 375/354 |
| 6,091,705 A | * | 7/2000 | Regula | 370/223 |
| 6,255,880 B1 | * | 7/2001 | Nguyen | 327/277 |
| 6,404,833 B1 | * | 6/2002 | Takebe | 375/371 |

* cited by examiner

*Primary Examiner*—Ricky Ngo
*Assistant Examiner*—Christine Ng
(74) *Attorney, Agent, or Firm*—Lisa K. Jorgenson; Allen, Dyer, Doppelt, Milbrath & Gilchrist, P.A.

(57) ABSTRACT

A switching circuit is for switching an output thereof to one of a plurality of N input clock signals which are delayed relative to one another. The switching circuit includes at least one circuit responding to a control signal to enable the transmission, on an output signal, of a new signal of the plurality of input signals. The new signal is advanced or delayed relative to a current signal of the plurality of input signals which is currently transmitted on the output signal. The at least one circuit enables the transmission of the new signal before disabling the transmission of the current signal on the output signal. This substantially prevents the production of false signals during the switching of the output signal from one of the clock signals to another.

18 Claims, 5 Drawing Sheets

SYNCHRONISM PHASE-SWITCHING CIRCUIT FOR THE RECOVERY OF RECEIVED DATA

FIELD OF THE INVENTION

The present invention relates to the field of telecommunications, and, more particularly, to the transmission of data in a digital format such as synchronous data transmission. Furthermore, the invention relates to recovering data from a data flow received from a communication channel in which the data is transmitted serially and in baseband.

BACKGROUND OF THE INVENTION

It is necessary to know precisely a so-called "bit time" during the synchronous transmission of serial digital data in baseband. The bit time is the period of time during which each individual bit of data is transmitted and travels on the communication channel. The bits are transmitted in series and travel in the form of pulses. Further, each pulse occupies (at least theoretically) its own elemental time interval ("time slot"), which is also called a "unitary interval" or "UI". The duration of this elemental time interval is the reciprocal of the data-transmission rate (i.e, the data rate).

After normal processing for automatic equalization and squaring, the received signal is in the form of square pulses. In order to reconstruct the value of an individual bit of data arriving on the communication channel, the receiving circuits have to know precisely the moment at which the bit arrives, i.e., the moment of arrival of the pulse that corresponds to the bit.

Data codes of various types are used in semi-duplex serial transmission. When the shape of the signal within the time domain and its spectral content are processed by the receiving circuits, they can identify the moment in time at which the arriving pulse should be evaluated as the value of the arriving bit of data. The process of identifying the moment at which to evaluate the pulses is called clock data recovery (CDR).

There are various known prior art methods of recovering clock data. A summary of these methods is provided, for example, in B. Razavi, "Design of Monolithic Phase-Locked Loops and Clock Recovery Circuits—A Tutorial", IEEE Press, 1995. These methods are described with reference to applications in which the data is transmitted in baseband with non-return-to-zero (NRZ) code. In particular, the use of circuits for switching between a plurality of digital phase signals to identify and follow the timing of the data received is described.

In addition to the NRZ code, another type of code which is known and used in the synchronous serial transmission of digital data in baseband is code mark inversion (CMI) code. CMI code is used, for example, within the field of synchronous data transmission in accordance with the synchronous digital hierarchy (SDH) standard. The SDH standard prescribes predetermined transmission rates, for example: 51.84 Mbit/s (base rate), 155.52 Mbit/s, 622.08 Mbit/s, etc. All of the prescribed transmission rates are whole multiples of the base rate.

In accordance with the SDH standard, Recommendation G.703 issued by the CCITT committee of the International Telecommunication Union (ITU) prescribes the electrical/physical characteristics of the hierarchical digital interfaces to be used to interconnect components of digital networks which conform to the SDH standard. In particular, Recommendation G.703 prescribes the type of data code to be used for each transmission rate. For example, for 155.52 Mbit/s transmission/receiving interfaces (also known as bidirectional or transceiver interfaces), CMI code should be used.

CMI code is a code with two levels A1 and A2. These levels are typically low and high, and a binary "0" is encoded to have the two levels A1 and A2, in succession, each for a period equal to half of the bit-time. A binary "1" is encoded by one or the other of the two levels A1 or A2, which is maintained throughout the bit time. The two levels A1, A2 alternate for successive binary "1"s.

CMI code intrinsically incorporates a strong clock signal. The known solutions for clock data recovery for codes which intrinsically carry a strong clock signal provide for an analog phase-locked loop (PLL) circuit. This PLL circuit operates at a frequency of twice the data transmission rate (the data rate) to be able to control the content at twice the intrinsic frequency of the CMI code.

It is also known in the art to use digital PLL circuits which use a rapid clock signal or a multi-phase local clock signal. This signal is a signal which includes a plurality of clock signals out of phase with one another in time. Such PLL circuits may also follow the data received and dynamically select the best phase for sampling the data. Such a circuit is known by the name of a phase-switching CDR circuit. It includes a switching circuit which receives as inputs a number N clock signals or synchronism phases spaced at regular time intervals. This circuit can select which of the phases is best for use as a synchronism signal for sampling the next bit of data.

In these circuits, however, there exists a problem in preventing the production of false signals or glitches caused by spurious transitions. Such false signals could cause incorrect sampling of the incoming bit of data during the change from one phase to the phase following or preceding it in terms of time delay. This gives rise to vibrations (i.e., jitter) in the recovery of the arriving clock data.

SUMMARY OF THE INVENTION

An object of the present invention is to provide a switching circuit, particularly for use as a synchronism-phase switching circuit, which is substantially immune to the above-mentioned problems and, in particular, is substantially immune to false signals or glitches during the change from one phase to the adjacent phase. As a result, the recovery of the incoming clock data has a high tolerance to jitter.

According to the present invention, a switching circuit is provided for switching an output to one of a plurality of N input clock signals which are delayed relative to one another. The switching circuit includes circuit means responding to a control signal to enable the transmission, on the output signal, of a new signal of the plurality of input signals. The new signal is advanced or delayed relative to a current signal of the plurality of input signals which is currently transmitted on the output signal. The circuit means enables the transmission of the new signal before disabling the transmission of the current signal on the output signal to prevent the production of false signals during the switching of the output signal from one of the clock signals to another.

BRIEF DESCRIPTION OF THE DRAWINGS

The characteristics and advantages of the present invention will become clearer from the following detailed description of an embodiment thereof, illustrated purely by way of non-limitative example in the appended drawings, in which.

DETAILED DESCRIPTION OF THE PREFERRED EMBODIMENTS

Figure 1:
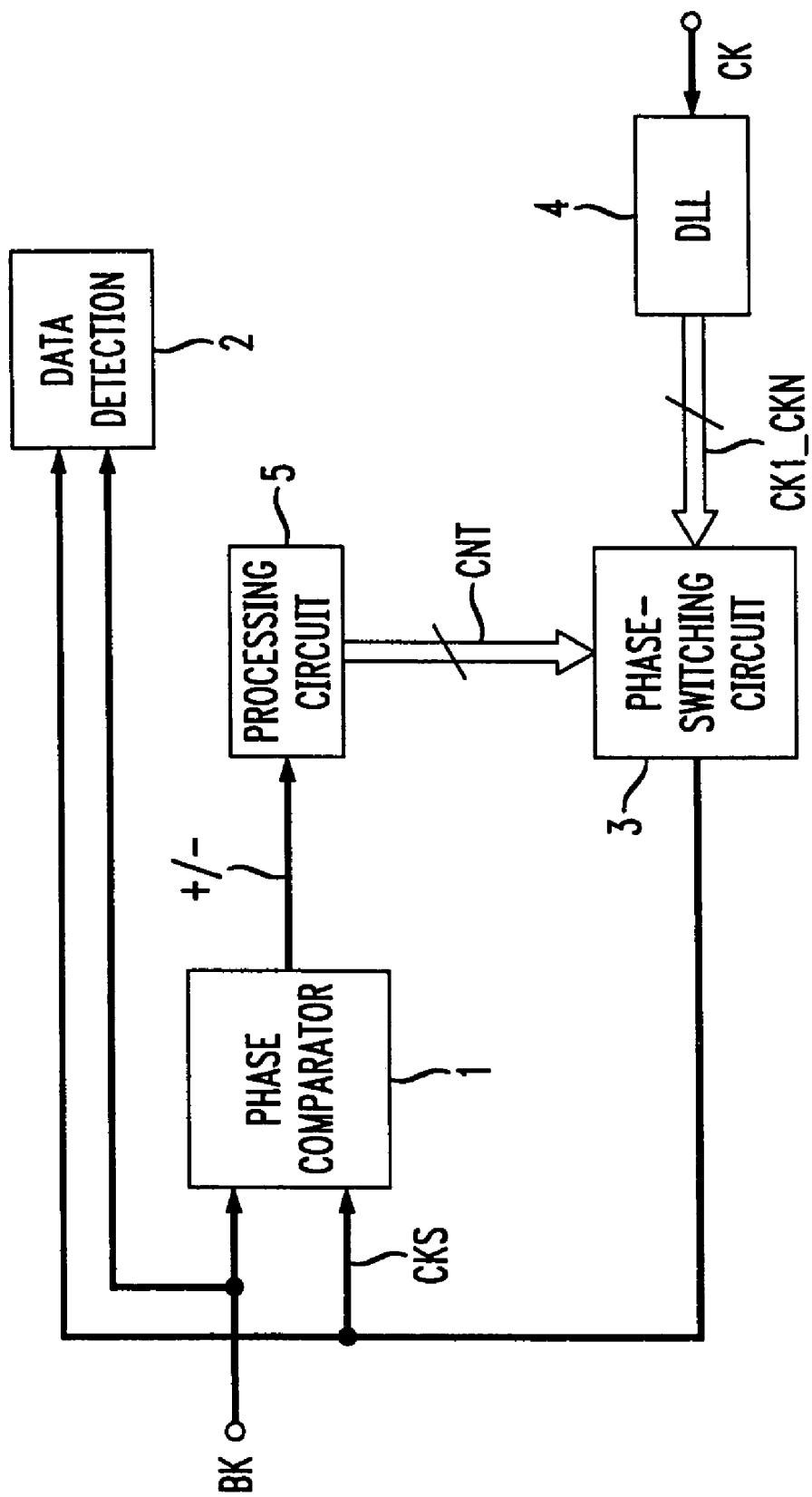
FIG. 1 is a schematic block diagram of a circuit for receiving a flow of data including a synchronization-phase switching circuit according to the present invention.

With reference to the drawings, a basic block diagram of a circuit for receiving a data flow is illustrated in FIG. 1. A signal line BK coming from a communication channel carries a flow of data being received, particularly a serial flow of baseband digital data, for example, with a CMI code. The signal line BK is connected to an input of a phase comparator 1 and, in parallel, to data-detection circuitry 2. A synchronization signal CKS is also supplied as an input to the phase comparator 1 and to the data-detection circuitry 2. The synchronization signal CKS is used by the circuitry 2 for sampling the data on the signal line BK.

The synchronization signal CKS is output by a synchronization phase-switching circuit 3. The phase-switching circuit 3 receives as inputs a plurality of N phases or local clock signals CK1–CKN of equal period T and delayed relative to one another by fractions of the period T, for example, with uniform delays T/N of one relative to the next. In a particular example of use, the N local clock signals CK1–CKN are generated by a delay-locked loop circuit (DLL) 4 which generates the N signals CK1–CKN from a single local clock signal CK of period T, generated locally. The synchronism signal CKS is one of the N signals CK1–CKN. The period T of the signals CK1–CKN is nominally equal to the bit time in the data flow arriving on the signal line BK. That is, it corresponds to the transmission data rate apart from the tolerances in the frequency values of the quartz crystals which generate the clock signals during transmission and receipt.

The phase comparator 1 compares the signal on the signal line BK and the signal CKS. The phase comparator 1 outputs signals which are schematically indicated in the drawing by the signal +/− and are representative of the phase advance or delay between the signal CKS and the signal arriving on the signal line BK. The signals +/− are supplied as inputs to a processing circuit 5.

The processing circuit 5 may include filters, serializers, or other means for controlling the dynamic response of the loop formed by the phase-switching circuit 3, the phase comparator 1, and the processing circuit 5 itself. In particular, the processing circuit 5 may include a counting circuit or counter. The counter increases or decreases the count based upon of the signals +/− and supplies the current result of the count to the switching circuit 3 in the form of an encoded word CNT.

Figure 2:
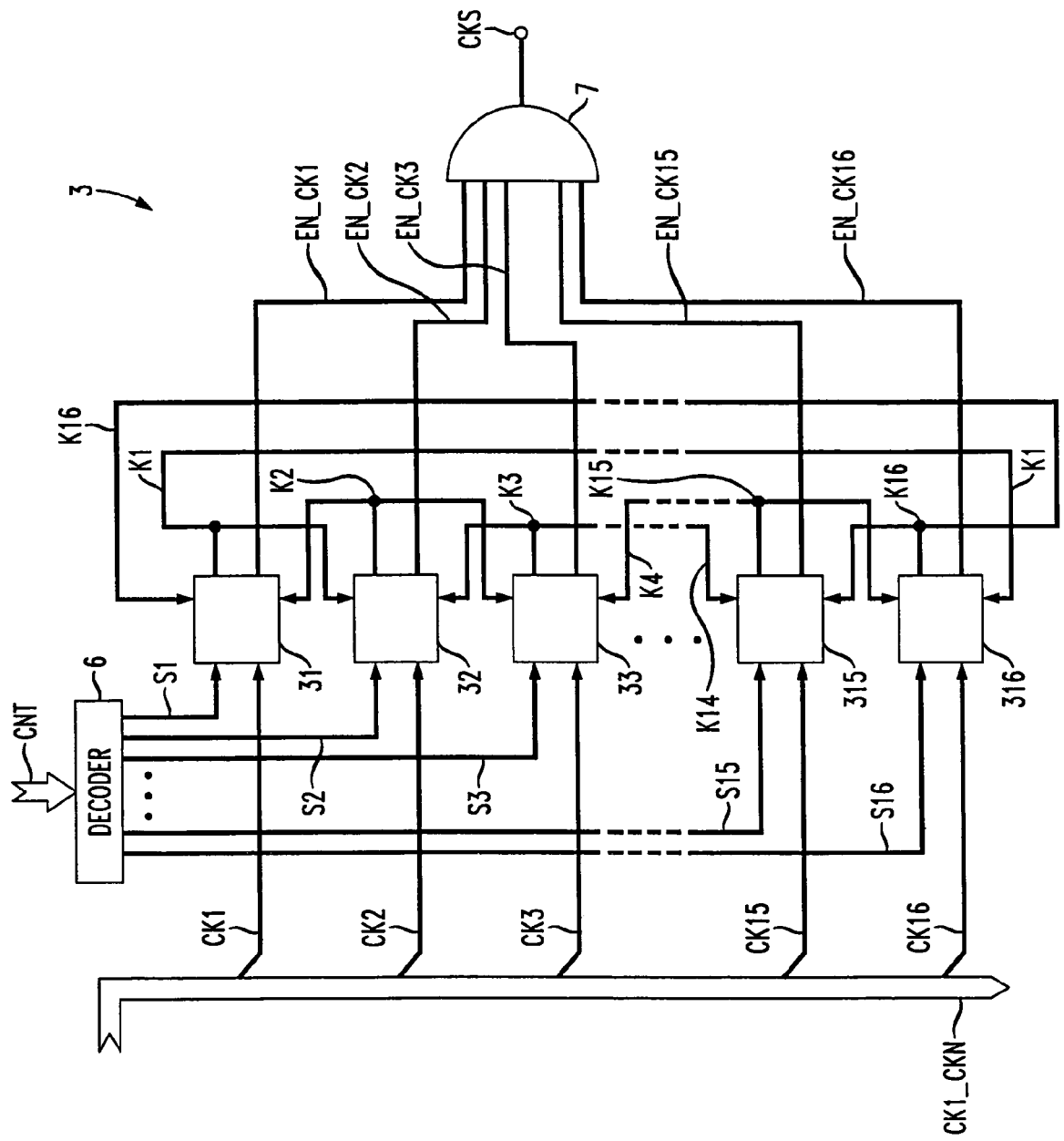
FIG. 2 is a more detailed schematic block diagram of the synchronization-phase switching circuit of FIG. 1.

Referring to the block diagram of FIG. 2, a particular embodiment of the synchronism-phase switching circuit 3 is shown in which the number N of local clock signals CK1–CKN is sixteen. It is important to note that this number provides only one possible example and should not be understood as limiting the present invention.

The switching circuit 3 includes a plurality of N substantially identical circuit blocks 31–316 equal to the number of phases to be switched (sixteen in the example shown). Each of the blocks 31–316 receives as an input a respective one of the N local clock signals CK1–CK16. The switching circuit 3 also includes a decoding circuit 6 which receives and decodes the encoded word CNT supplied by the processing circuit 5. The decoding circuit 6 outputs N signals S1–S16, each of which is supplied as an input to a respective one of the N blocks 31–316.

Each of the blocks 31–316 outputs a respective synchronism signal EN_CK1–EN_CK16 which, when enabled, substantially coincides with the respective local clock signal CK1–CK16 input to the block. The signals EN_CK1–EN_CK16 are supplied as inputs to an AND gate 7. The output of the AND gate 7 provides the synchronism signal CKS, i.e., the local clock signal selected from the N local clock signals CK1–CKN.

In addition to the respective signal EN_CK1–EN_CK16, each block 31–316 outputs a further respective signal K1–K16 which is supplied as an input to the block preceding and to the block following the block itself. In other words, a generic block 3$i$ (where $2 \leq i \leq 15$) generates, in addition to the respective signal EN_CKi, a further respective signal Ki. The signal Ki is supplied as an input to the block 3(i−1) and to the block 3(i+1). The signal K1 generated by the block 31 is supplied to the block 316 as well as to the next block 32. Similarly, the signal K16 generated by the block 316 is supplied to the block 31 as well as to the preceding block 315. The blocks 31–316 are thus connected to form a ring.

Figure 3:
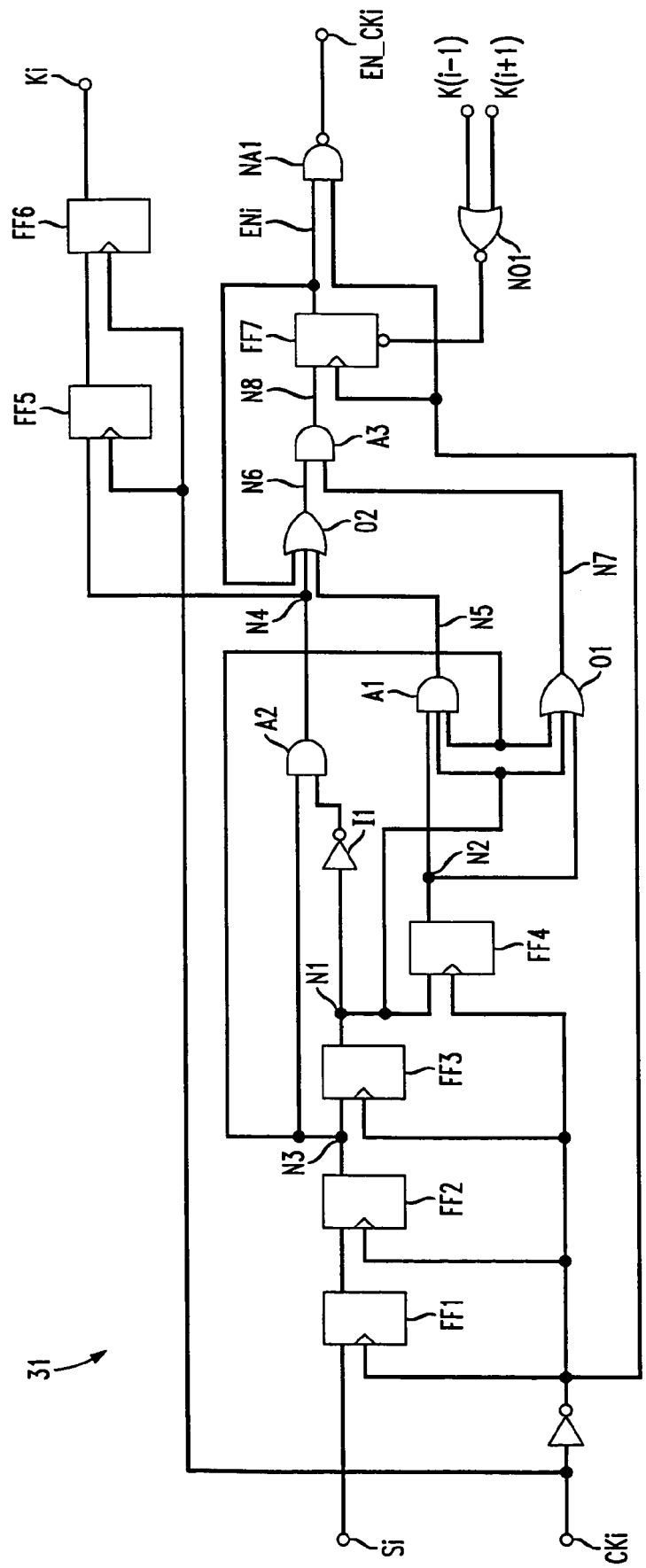
FIG. 3 is a more detailed schematic diagram of a circuit block of the synchronization switching circuit of FIG. 2, and FIGS. 4 and 5 are timing diagrams of the most significant signals of the circuit of FIG. 2 respectively showing two cases of switching between synchronization phases.

A detailed diagram of one possible embodiment of the internal structure of the blocks 31–316 may be seen in FIG. 3. The respective signal Si coming from the decoding circuit 6 is supplied as an input to a chain of, for example, three D-type flip-flops FF1–FF3, i.e., three D-type flip-flops in which the (direct) output of one flip-flop is supplied to the input of the following flip-flop. The logic complement of the respective local clock signal CKi is supplied as a clock signal to the control or clock inputs of the flip-flops FF1–FF3, which act on the leading edges of the clock signals applied to them.

The (direct) output of the last flip-flop of the input chain (i.e., the output (node N1) of the flip-flop FF3) is supplied as an input to a further D-type flip-flop FF4. The control or clock input (which acts on the leading edge of the clock signal applied thereto) of the flip-flop FF4 also receives the logic complement of the signal CKi. The (direct) output of the flip-flop FF4 (node N2) is supplied to a first input of an AND gate A1 and, in parallel, to a first input of an OR gate O1. A second input of the AND gate A1 and a second input of the OR gate O1 receive the direct output of the flip-flop FF3 (node N1). A third input of the AND gate A1 and a third input of the OR gate O1 receive the direct output of the flip-flop FF2 (node N3).

The direct output of the flip-flop FF2 is also supplied to a first input of an AND gate A2. The logic complement of the (direct) output of the flip-flop FF3 is supplied to the second input of the AND gate A2 by an inverter I1. This produces a detect transition signal on the signal Si.

The output of the AND gate A2 (node N4) is supplied as an input to a chain of two D-type flip-flops FF5, FF6, of which the control or clock inputs (which act on the leading edges supplied thereto) receive the local clock signal CKi. The direct output of the flip-flop FF6 corresponds to the signal Ki which is supplied to the block 3(i−1) which precedes the block 3$i$ (or to the block 316 when the block 3$i$ is the block 31), and to the block 3(i+1) which follows the block 3$i$ (or to the block 31 when the block 3$i$ is the block 316).

The output of the AND gate A2 is also supplied to a first input of a triple OR gate O2. A second input of the triple OR gate O2 is supplied with the output signal of the AND gate A1 (node N5). The output of the OR gate O2 (node N6) is supplied to a first input of an AND gate A3. A second input of the AND gate A3 receives the output of the OR gate O1 (node N7). The output of the AND gate A3 (node N8) is supplied as an input to a D-type flip-flop FF7, of which the control or clock input (which acts on the leading edge of the signal applied thereto) receives the logic complement of the local clock signal CKi. The direct output ENi of the flip-flop FF7 is supplied to a first input of a NAND gate NA1 and also as feedback to a third input of the triple OR gate O2. The second input of the NAND gate NA1 receives the logic complement of the local clock signal CKi.

A resetting input of the flip-flop FF7 receives the output of a NOR gate NO1, the two inputs of which receive the signals K(i−1) and K(i+1) from the block 3(i−1) preceding the block 3i (or the signal K16 from the block 316 if the block 3i is the block 31) and from the block 3(i+1) following the block 3i (or the signal K1 from the block 31 if the block 3i is the block 316), respectively. The output of the NAND gate NA1 corresponds to the signal EN_CKi which is supplied, together with the output signals of the remaining blocks, to the AND gate 7 of FIG. 2 to generate the selected clock signal CKS.

The circuit operates as follows. With reference to FIG. 1, the phase comparator 1 makes a phase comparison between the signal arriving on the signal line BK, carrying the flow of data being received, and the current synchronism signal CKS. According to the outcome of the comparison (i.e., according to whether the current synchronism signal CKS is advanced or delayed relative to the signal BK), the phase comparator 1 instructs the processing circuit 5, and, more specifically, the counter contained therein, to increase or decrease the count.

The current count value held in the counter 5, which is encoded in the word CNT, is supplied to the phase-switching circuit 3. With reference to FIG. 2, the decoding circuit 6 provided in the phase-switching circuit 3 decodes the word CNT and consequently activates one of the signals S1–S16, leaving the remaining signals S1–S16 deactivated. The activation of one of the signals S1–S16 causes selection of the respective block 31–316.

With reference now to FIG. 3, the chain of flip-flops FF1–FF3, which samples the respective selection signal Si for a suitable number of periods T of the respective local clock signal CKi, serves to substantially prevent metastability. This provides a safety margin against the spurious selection of the block 31–316 corresponding to the signal S1–S16 that is activated, where such spurious selection may be caused by false activations or glitches of the signal Si.

The output signal ENi of the flip-flop FF7 acts as an enabling signal for the signal EN_CKi. When the block 3i is not selected (i.e., when the respective signal Si is at a low logic level), the enabling signal ENi is at the low logic level and the signal EN_CKi is forced to the high logic level. In fact, since the nodes N1, N2 and N3 are all at the low logic level, the output of the OR gate O1 (node N7) is at the low logic level so that the output of the AND gate A3 is at the low logic level.

When the selection signal Si is activated (i.e., brought to the high logic level) and kept at that level for more than three periods T of the local clock signal CKi, the nodes N1, N2 and N3 are brought to the high logic level. More specifically, the first node which is brought to the high logic level is the node N3, and this immediately brings about a transition of the node N7 to the high logic level, thus enabling the AND gate A3. At the same time, the node N4 (the output of the AND gate A2 which, together with the inverter I1, forms a pulse shaper) is also brought to the high logic level so that the node N6, and hence the node N8, are also brought to the high logic level.

The flip-flops FF1–FF3 are controlled by the logic complement of the signal CKi and load the datum present at their inputs when there is a leading edge of the logic complement, i.e., a trailing edge of the signal CKi. Thus, upon the next trailing edge of the signal CKi, and hence after a period T, the node N1 is also brought to the high logic level. This causes the node N4 to fall to the low logic level. However, upon the same trailing edge of the signal CKi, the high logic level present at the node N8 is sent forward to the output of the flip-flop FF7, i.e., the signal ENi is brought to the high logic level, enabling the NAND gate NA1. Once the enabling signal ENi has been activated, the NAND gate NA1 will have its first input at "1" and will therefore operate as an inverter on the signal supplied to its second input (i.e., the logic complement of the local clock signal CKi). After the enabling signal ENi has been activated, the output EN_CKi of the block therefore coincides substantially with the local clock signal CKi. The signal EN_CKi thus starts to switch in synchronization with the local clock signal CKi.

The pulse of duration T at the node N4 is sent forward again to the output of the flip-flop FF6 (i.e., on the signal Ki) with a delay of (3/2)T. This pulse, which is supplied to the blocks (3i−1) and 3(i+1) preceding and following the block 3i, respectively, resets the respective flip-flops FF7 in these blocks and thus changes the respective signals EN(i−1) and EN(i+1) to the low logic level. This forces the respective signals EN_CK(i−1) and EN_CK(i+1) to the high logic level.

In other words, the pulse on the signal Ki forces the signals EN_CK(i−1) and EN_CK(i+1) of the blocks adjacent the block 3i to the high logic level. Stated in yet another way, the enabling of a generic block 3i not only brings about activation of the respective output signal EN_CKi in synchronism with the trailing edge of the local clock signal CKi, but is also the event which brings about the deactivation (the forcing to the high logic level) by the selected block of the output signals of the two blocks adjacent thereto.

Figure 4:
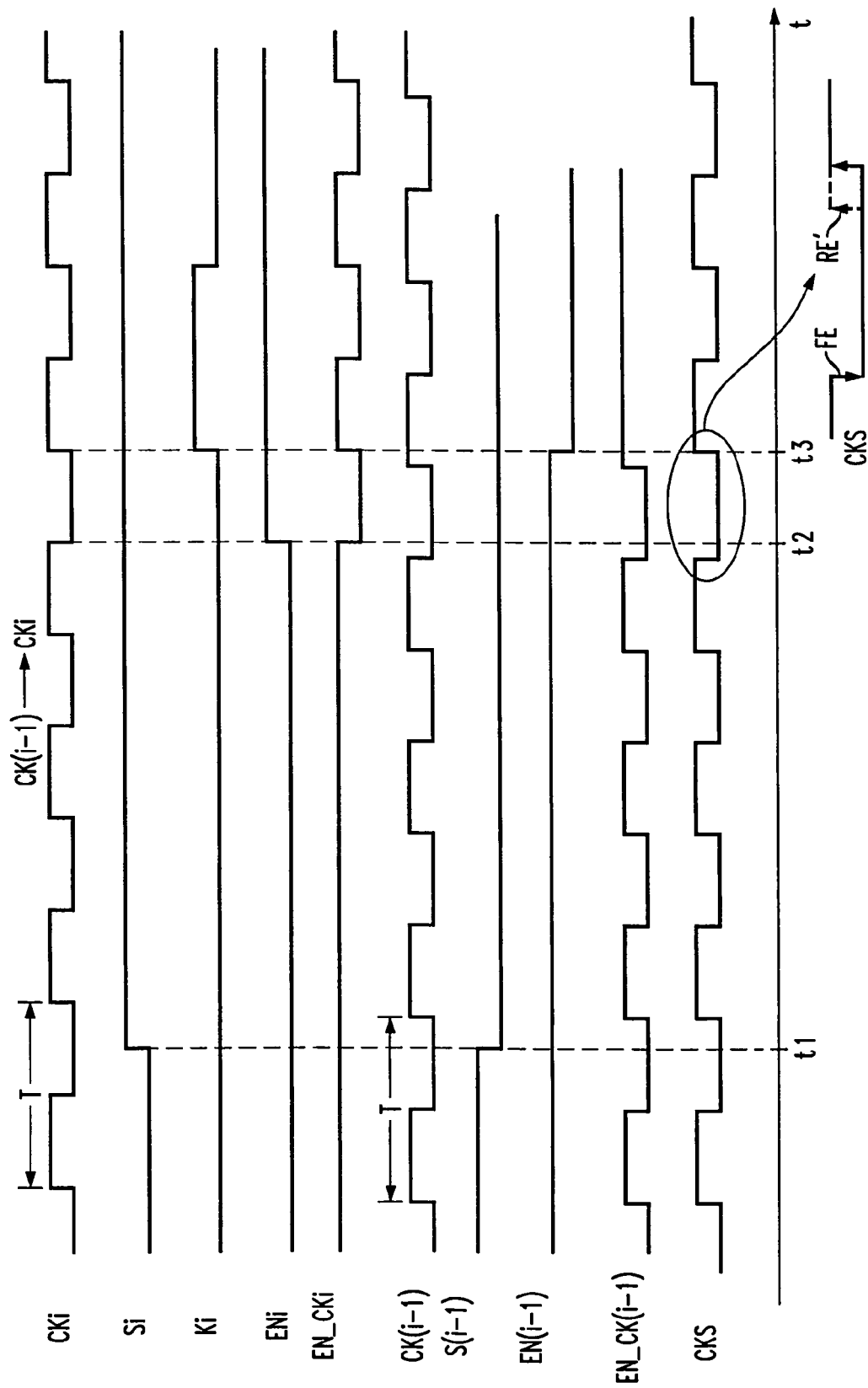
Figure 5:
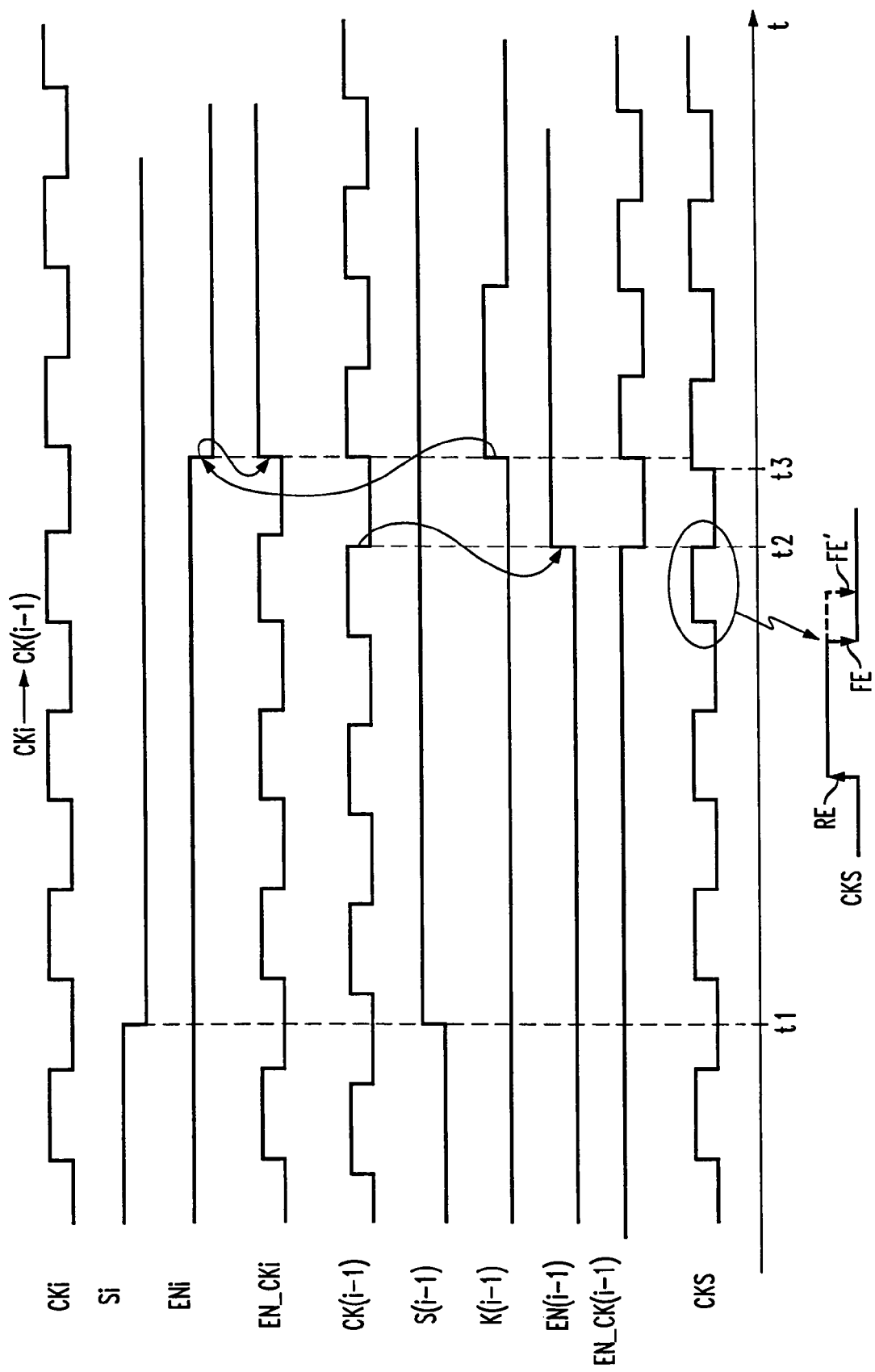

The timing diagrams shown in FIGS. 4 and 5 will aid in a better understanding of the operation of the circuit according to the invention. In particular, FIG. 4 shows a situation in which the phase comparator 1 detects that the synchronism signal CKS coinciding with the generic signal CK(i−1) of the set of N signals Ck1–CKN is advanced relative to the intrinsic timing of the flow of data arriving at BK. The switching circuit 3 therefore has to switch the signal CKS from the signal CK(i−1) to the signal CKi, which is delayed relative to the signal CK(i−1) by a further period fraction T/N. At the moment t1, the decoder 6 activates the selection signal Si of the block 3i and deactivates the selection signal S(i−1) of the block 3(i−1). In the block 3i, at the moment t2 the enabling signal ENi is activated in synchronism with the trailing edge of the respective signal CKi.

From this moment, the signal EN_CKi which was previously forced to the high logic level, starts to switch in synchronism with the signal CKi. At the moment t3, the pulse Ki is activated and forces the signal EN(i−1) to the low logic level, disabling the respective output EN_CK(i−1). The signal CKS, which coincided with the signal EN_CK (i−1) up to the moment t2 (the moment at which the signal EN_CKi was activated), coincides with the signal EN_CKi from the moment t3. When the switching takes place, the trailing edge FE of the signal CKS still coincides with the trailing edge of the signal EN_CK(i−1), whereas the subsequent leading edge RE coincides with the leading edge of the signal EN_CKi.

As may be seen in the detail shown on an enlarged scale in FIG. 4, the switching of the signal CKS from the signal EN_CK(i−1) to the signal EN_CKi corresponds, in this case, to a lengthening of the time for which the signal CKS remains at the low logic level. Relative to the trailing edge FE, the leading edge RE is delayed relative to the leading edge RE' which would occur if the signal CKS were to remain coincident with the signal EN_CK(i−1). It should be noted that the signal EN_CKi is enabled before the signal EN_CK(i−1) is disabled, in accordance with a "make before break" method.

On the other hand, a situation is illustrated in FIG. 5 in which the phase comparator 1 detects that the synchronism signal CKS coinciding with the generic signal CKi of the set CK1–CKN is delayed relative to the intrinsic timing of the arriving flow of data BK. The switching circuit 3 therefore has to switch the signal CKS from the signal CKi to the signal CK(i−1) which is advanced relative to the signal CKi by a period fraction T/N. At the moment t1, the decoder 6 activates the selection signal (Si−1) of the block 3(i−1) and deactivates the selection signal Si of the block 3i. In the block 3(i−1), the enabling signal EN(i−1) is activated at the moment t2, in synchronism with the trailing edge of the respective signal CK(i−1).

From this moment, the signal EN_CK(i−1), which was previously forced to the high logic level, starts to switch in synchronism with the signal CK(i−1). At the moment t3, the pulse K(i−1) is activated and forces the signal ENi to the low logic level, disabling the respective output EN_CKi (i.e., forcing it to the high logic level). The signal CKS is forced to the low logic level by the signal EN_CK(i−1) at the moment t2 (the moment at which the signal EN_CK(i−1) is activated).

When the switching takes place, the leading edge RE of the signal CKS still coincides with the leading edge of the signal EN_CKi, whereas the next trailing edge FE coincides with the trailing edge of the signal EN_CK(i−1). As can be seen in the detail shown on an enlarged scale in FIG. 5, the switching of the signal CKS from the signal EN_CKi to the signal EN_CK(i−1) corresponds, in this case, to a shortening of the time for which the signal CKS remains at the high logic level. Relative to the leading edge RE, the trailing edge FE is in advance of the trailing edge FE' that would occur if the signal CKS were to remain coincident with the signal EN_CKi. In this case, the signal EN_CK(i−1) is also enabled before the signal EN_CKi is disabled.

Thus, in neither case are spurious transitions (glitches) produced on the synchronism signal CKS. By virtue of the make before break method of enabling the signals EN_CKi, there is substantially no risk of the old signal EN_CKi being disabled before the new signal has effectively been enabled. This could otherwise cause glitches in the synchronism signal CKS because of delays in the enabling of the new signal EN_CKi.

It is clear that the foregoing description relates merely to one of the possible practical embodiments of the present invention. Those of skill in the art will be able to provide for variants and/or additions to the embodiment described and illustrated without departing from the scope of the invention defined in the appended claims.

Moreover, although the description provided refers to a switching circuit to be used for switching synchronism phases in the field of the synchronous serial transmission of digital data, clearly this application is not limiting. That is, the switching circuit according to the invention may be used, more generally, wherever there is a need to perform a switching of a signal to one of a plurality of timing signals which are delayed relative to one another without the risk of giving rise to glitches.

That which is claimed is:

1. A circuit for recovering data from a serial data flow comprising:
   a generator for generating a plurality of clock signals of equal period that are delayed equally relative to one another by a fraction equal to the period divided by a number of the plurality of clock signals;
   a switching circuit for receiving the plurality of clock signals and providing one of the clock signals as an output thereof;
   a phase comparator for receiving the output from said switching circuit and a data flow signal comprising a flow of data and providing at least one phase difference signal indicating a phase difference therebetween;
   a data sampler receiving as inputs the data flow signal and the output of said switching circuit, and synchronizing sampling of the data flow signal based upon the output of said switching circuit; and
   a controller for receiving the at least one phase difference signal from said phase comparator and controlling the switching circuit based thereon to switch the output of said switching circuit to one of said clock signals providing a smaller phase difference than a current clock signal;
   said switching circuit providing the output synchronously with a transition of the output and before disabling a current output to substantially prevent the production of false signals during switching.

2. The circuit according to claim 1 wherein said generator comprises a delay-locked loop circuit.

3. The circuit according to claim 1 wherein said switching circuit comprises a plurality of circuits each receiving a respective one of the plurality of clock signals as an input thereto and selectively outputting the input as the output of said switching circuit.

4. The circuit according to claim 3 wherein said plurality of circuits are connected in a ring; and wherein each of said plurality of circuits provides a respective disabling signal upon being selected to adjacent circuits in the ring to disable said adjacent circuits.

5. The circuit according to claim 4 wherein said switching circuit further comprises a decoding circuit for receiving at least one control signal from said controller and providing at least one selection signal for activating one of said plurality of circuits based upon on a state of the at least one control signal.

6. The circuit according to claim 5 wherein each of the clock signals is delayed equally relative to one another by a fraction equal to the period divided by a number of said plurality of circuits.

7. The circuit according to claim 5 wherein each disabling signal comprises a pulse; and wherein each of said plurality of circuits generates its respective pulse based upon the at least one selection signal.

8. The circuit according to claim 7 wherein each of said plurality of circuits provides an enabling signal for enabling the transmission of its respective clock signal based upon the at least one selection signal, the enabling signal being activated synchronously with a trailing edge of the respective clock signal.

9. The circuit according to claim 8 wherein each of said plurality of circuits deactivates its respective enabling signal upon receiving the disabling signal.

10. A method for recovering data from a serial data flow comprising:
   generating a plurality of clock signals of equal period that are delayed equally relative to one another by a fraction equal to the period divided by a number of the plurality of clock signals;
   receiving the plurality of clock signals at a switching circuit and providing one of the clock signals as an output thereof;
   providing at least one phase difference signal indicating a phase difference between the output from the switching circuit and a data flow signal comprising a flow of data;
   synchronizing sampling of the data flow signal based upon the output of the switching circuit; and
   controlling the switching circuit based upon the at least one phase difference signal to switch the output of the switching circuit to one of the clock signals providing a smaller phase difference than a current clock signal and so that the switching circuit provides the output synchronously with a transition of the output and before disabling a current output to substantially prevent the production of false signals during switching.

11. The method according to claim 10 wherein generating comprises generating the plurality of clock signals using a delay-locked loop circuit.

12. The method according to claim 10 wherein the switching circuit comprises a plurality of circuits each receiving a respective one of the plurality of clock signals as an input thereto and selectively outputting the input as the output of the switching circuit.

13. The method according to claim 12 wherein the plurality of circuits are connected in a ring; and wherein each of the plurality of circuits provides a respective disabling signal upon being selected to adjacent circuits in the ring to disable the adjacent circuits.

14. The method according to claim 13 wherein controlling comprises controlling using at least one control signals; and wherein the switching circuit further comprises a decoding circuit for receiving at least one control signal and providing at least one selection signal for activating one of the plurality of circuits based upon on a stats of the at least one control signal.

15. The method according to claim 14 wherein each of the clock signals is delayed equally relative to one another by a fraction equal to the period divided by a number of the plurality of circuits.

16. The method according to claim 14 wherein each disabling signal comprises a pulse; and wherein each of the plurality of circuits generates its respective pulse based upon the at least one selection signal.

17. The method according to claim 16 wherein each of the plurality of circuits provides an enabling signal for enabling the transmission of its respective clock signal based upon the at least one selection signal, the enabling signal being activated synchronously with a trailing edge of the respective clock signal.

18. The method according to claim 17 wherein each of the plurality of circuits deactivates its respective enabling signal upon receiving the disabling signal.

* * * * *

UNITED STATES PATENT AND TRADEMARK OFFICE
CERTIFICATE OF CORRECTION

PATENT NO. : 6,990,122 B2 Page 1 of 1
APPLICATION NO. : 09/784549
DATED : January 24, 2006
INVENTOR(S) : Guinea et al.

It is certified that error appears in the above-identified patent and that said Letters Patent is hereby corrected as shown below:

Column 3, Line 56    Delete: "upon of the"
                     Insert: --upon the--

Column 10, Line 7    Delete "signals; and"
                     Insert: --signal; and--

Column 10, Line 12   Delete: "stats"
                     Insert: --state--

Signed and Sealed this

First Day of August, 2006

JON W. DUDAS
*Director of the United States Patent and Trademark Office*